United States Patent
Beam, III et al.

(10) Patent No.: US 9,865,721 B1
(45) Date of Patent: Jan. 9, 2018

(54) HIGH ELECTRON MOBILITY TRANSISTOR (HEMT) DEVICE AND METHOD OF MAKING THE SAME

(71) Applicant: Qorvo US, Inc., Greensboro, NC (US)

(72) Inventors: Edward A. Beam, III, Plano, TX (US); Jinqiao Xie, Allen, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/354,487

(22) Filed: Nov. 17, 2016

Related U.S. Application Data

(60) Provisional application No. 62/350,229, filed on Jun. 15, 2016.

(51) Int. Cl.

| | | |
|---|---|---|
| H01L 29/778 | (2006.01) | |
| H01L 29/20 | (2006.01) | |
| H01L 29/207 | (2006.01) | |
| H01L 29/205 | (2006.01) | |
| H01L 29/34 | (2006.01) | |
| H01L 29/66 | (2006.01) | |
| H01L 29/36 | (2006.01) | |
| H01L 29/08 | (2006.01) | |

(52) U.S. Cl.
CPC ...... *H01L 29/7786* (2013.01); *H01L 29/0891* (2013.01); *H01L 29/2003* (2013.01); *H01L 29/205* (2013.01); *H01L 29/207* (2013.01); *H01L 29/34* (2013.01); *H01L 29/36* (2013.01); *H01L 29/66462* (2013.01)

(58) Field of Classification Search
CPC ............. H01L 29/7786; H01L 29/2003; H01L 29/207; H01L 29/36; H01L 29/7787; H01L 29/34
See application file for complete search history.

(56) References Cited

U.S. PATENT DOCUMENTS

| | | | |
|---|---|---|---|
| 2007/0077745 A1* | 4/2007 | He | H01L 21/28581 438/604 |
| 2008/0230784 A1* | 9/2008 | Murphy | H01L 27/0605 257/76 |

(Continued)

OTHER PUBLICATIONS

Fritze, S. et al., "High Si and Ge n-type doping of GaN doping—Limits and impact on stress," Applied Physics Letters, vol. 100, No. 12, Mar. 2012, pp. 122104-1 to 122104-4.

(Continued)

*Primary Examiner* — Daniel Luke
(74) *Attorney, Agent, or Firm* — Withrow & Terranova, P.L.L.C.

(57) ABSTRACT

A high electron mobility transistor (HEMT) device with epitaxial layers that include a gallium nitride (GaN) layer co-doped with silicon (Si) and germanium Ge and a method of making the same is disclosed. The HEMT device includes a substrate with epitaxial layers over the substrate. An n-type gallium nitride (GaN) layer is disposed on an interface surface of the epitaxial layers, wherein the n-type GaN layer is co-doped with silicon (Si) and germanium (Ge) that provide a carrier concentration of at least $1 \times 10^{20}$ cm$^{-3}$ and a root mean square (RMS) surface roughness that is no greater than 2 nm for a contact surface of the n-type GaN layer that is interfaced with the interface surface of the epitaxial layers.

20 Claims, 8 Drawing Sheets

(56) References Cited

U.S. PATENT DOCUMENTS

| | | | |
|---|---|---|---|
| 2008/0265258 A1* | 10/2008 | Tanabe | H01L 29/7787 257/76 |
| 2012/0139084 A1* | 6/2012 | Hagleitner | H01L 21/28575 257/615 |
| 2017/0125545 A1* | 5/2017 | Yamada | H01L 21/2258 |
| 2017/0125567 A1* | 5/2017 | Yamada | H01L 21/0254 |

OTHER PUBLICATIONS

Hageman, P.R. et al., "n-type doping of wurtzite GaN with germanium grown with plasma-assisted molecular beam epitaxy," Journal of Crystal Growth, vol. 267, Nos. 1-2, Jun. 2004, pp. 123-128.

* cited by examiner

HIGH ELECTRON MOBILITY TRANSISTOR (HEMT) DEVICE AND METHOD OF MAKING THE SAME

RELATED APPLICATIONS

This application claims the benefit of provisional patent application Ser. No. 62/350,229, filed Jun. 15, 2016, the disclosure of which is hereby incorporated herein by reference in its entirety.

FIELD OF THE DISCLOSURE

The present disclosure relates to a high electron mobility (HEMT) device and, in particular, to the use of co-doping to extend an upper limit of n-type active carrier concentration in a layer of the HEMT device while maintaining smooth surface/interface morphology between the layer and epitaxial layers.

BACKGROUND

Re-grown n-type gallium nitride (GaN) contact layers are becoming increasingly important, particularly for highly-scaled, high-speed GaN high electron mobility transistor (HEMT) structures. Traditional doping of GaN either with silicon (Si) alone or germanium (Ge) alone results in drawbacks relative to maximum active carrier concentration, atomic solubility, lattice strain and morphology degradation. In particular, achieving a relatively high maximum active carrier concentration along with maintaining a relatively a smooth surface/interface morphology between a traditionally doped layer and other epitaxial layers remains elusive. As such, a need remains for providing a HEMT device having an extended upper limit of n-type active carrier concentration in a layer of the HEMT device while maintaining a smooth surface/interface morphology between the layer and other epitaxial layers.

SUMMARY

A high electron mobility transistor (HEMT) device with epitaxial layers that include a gallium nitride (GaN) layer co-doped with silicon (Si) and germanium Ge along with a method of making the HEMT device is disclosed. The HEMT device includes a substrate with epitaxial layers over the substrate. An n-type gallium nitride (GaN) layer is disposed on an interface surface of the epitaxial layers, wherein the n-type GaN layer is co-doped with silicon (Si) and germanium (Ge) that provide a carrier concentration of at least $1\times10^{20}$ cm$^{-3}$ and a root mean square (RMS) surface roughness that is no greater than 2 nm for a contact surface of the n-type GaN layer that is interfaced with the interface surface of the epitaxial layers.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
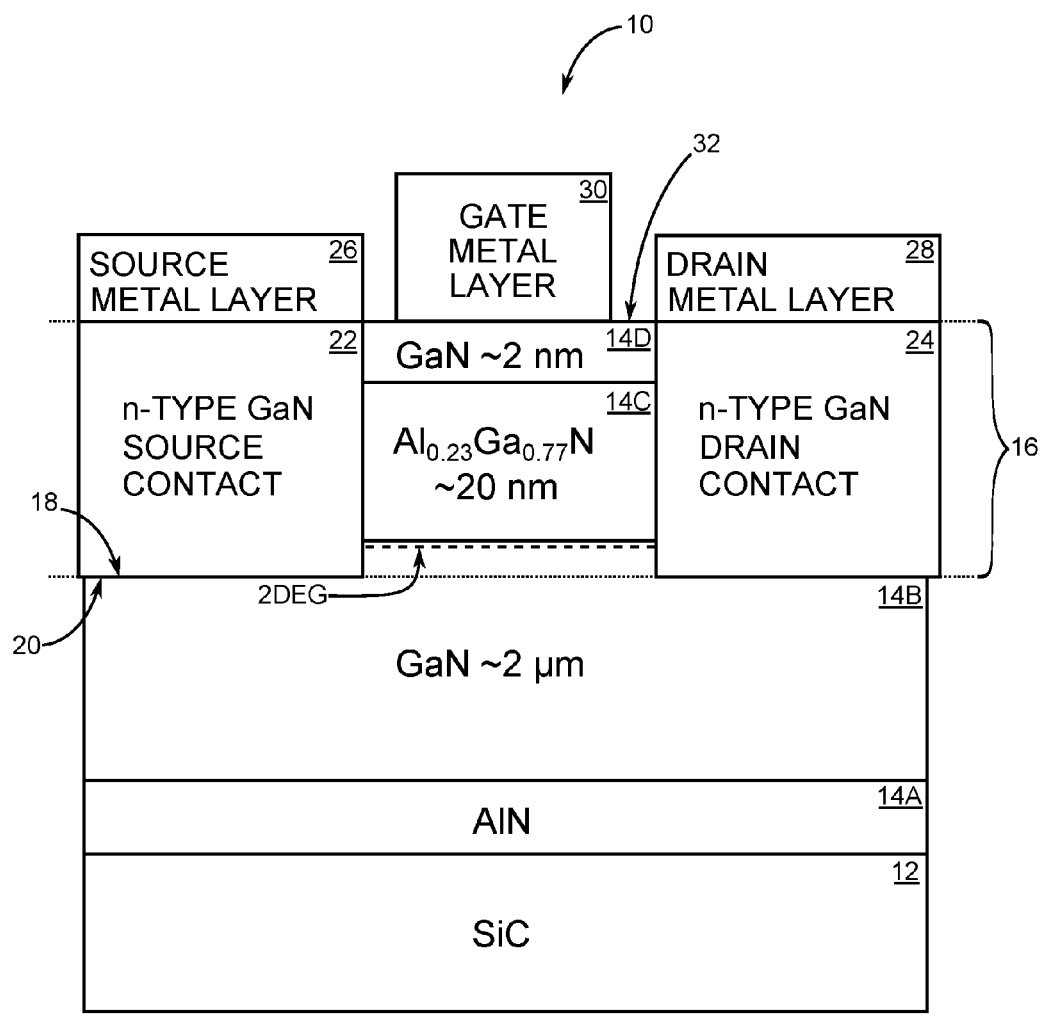
FIG. 1 is a cross-sectional diagram of a GaN based HEMT device of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a cross-sectional diagram of a GaN based HEMT device 10 of the present disclosure. The HEMT device 10 includes a substrate 12 with epitaxial layers 14A-14D disposed over the substrate 12 made of silicon carbide (SiC). Other substrate materials such as sapphire and silicon are also available.

The compositions of epitaxial layers 14A-14D are exemplary. Therefore, other compositions for epitaxial layers 14A-14D will occur to those skilled in the art. Such compositions are within the scope of the present disclosure. In the exemplary embodiment of FIG. 1, epitaxial layer 14A is made of aluminum nitride (AlN) and functions as a nucleation layer between the epitaxial layer 14B and the substrate 12. The epitaxial layer 14B is a buffer layer made of GaN. The epitaxial layer 14C is a barrier layer made of AlGaN, and the epitaxial layer 14D is a cap layer made of a GaN.

An n-type gallium nitride (GaN) layer 16 is disposed on an interface surface 18 of the epitaxial layers 14A-14D, wherein the n-type GaN layer 16 is co-doped with silicon (Si) and germanium (Ge) that provide a carrier concentration of at least $1 \times 10^{20}$ cm$^{-3}$ and a root mean square (RMS) surface roughness that is no greater than 2 nm for a contact surface 20 of the n-type GaN layer 16 that is interfaced with the interface surface 18 of the epitaxial layers 14A-14D.

In the exemplary embodiment of FIG. 1, the n-type GaN layer 16 is a contact layer that is divided into a source contact 22 and a drain contact 24, wherein the source contact 22 and the drain contact 24 are spaced apart from each other. A source metal layer 26 is disposed over the source contact 22, and a drain metal layer 28 is disposed over the drain contact 24. A gate metal layer 30 is disposed on another surface 32 of the epitaxial layers 14A-14D, wherein the gate metal layer 30 is spaced apart from both the source contact 22 and the drain contact 24.

The n-type GaN layer 16 is co-doped with both silicon (Si) and germanium (Ge). Embodiments of the HEMT device 10 include the n-type GaN layer 16 having a Ge dopant level that is in the range of $1 \times 10^{20}$ cm$^{-3}$ to $7 \times 10^{20}$ cm$^{-3}$. Moreover, the n-type GaN layer 16 has a total dopant level of both Si and Ge that is in the range of $2 \times 10^{20}$ cm$^{-3}$ to $9 \times 10^{20}$ cm$^{-3}$. Further still, in at least some embodiments of the HEMT device 10, the n-type GaN layer 16 has a resistivity that is in the range of 100 micro-ohms cm (μΩ·cm) to 300 μΩ·cm.

In at least some embodiments of the HEMT device 10, the n-type GaN layer 16 also has a Hall mobility that is finite and greater than 30 square centimeters per volt-seconds (cm$^2$/Vsec). In another embodiment, the n-type GaN layer 16 also has a Hall mobility that is finite and greater than 50 cm$^2$/Vsec. In other embodiments of the HEMT device 10, the n-type GaN layer 16 has a Hall carrier concentration in the range of $4 \times 10^{20}$ cm$^{-3}$ and $9 \times 10^{20}$ cm$^{-3}$.

Figure 2:
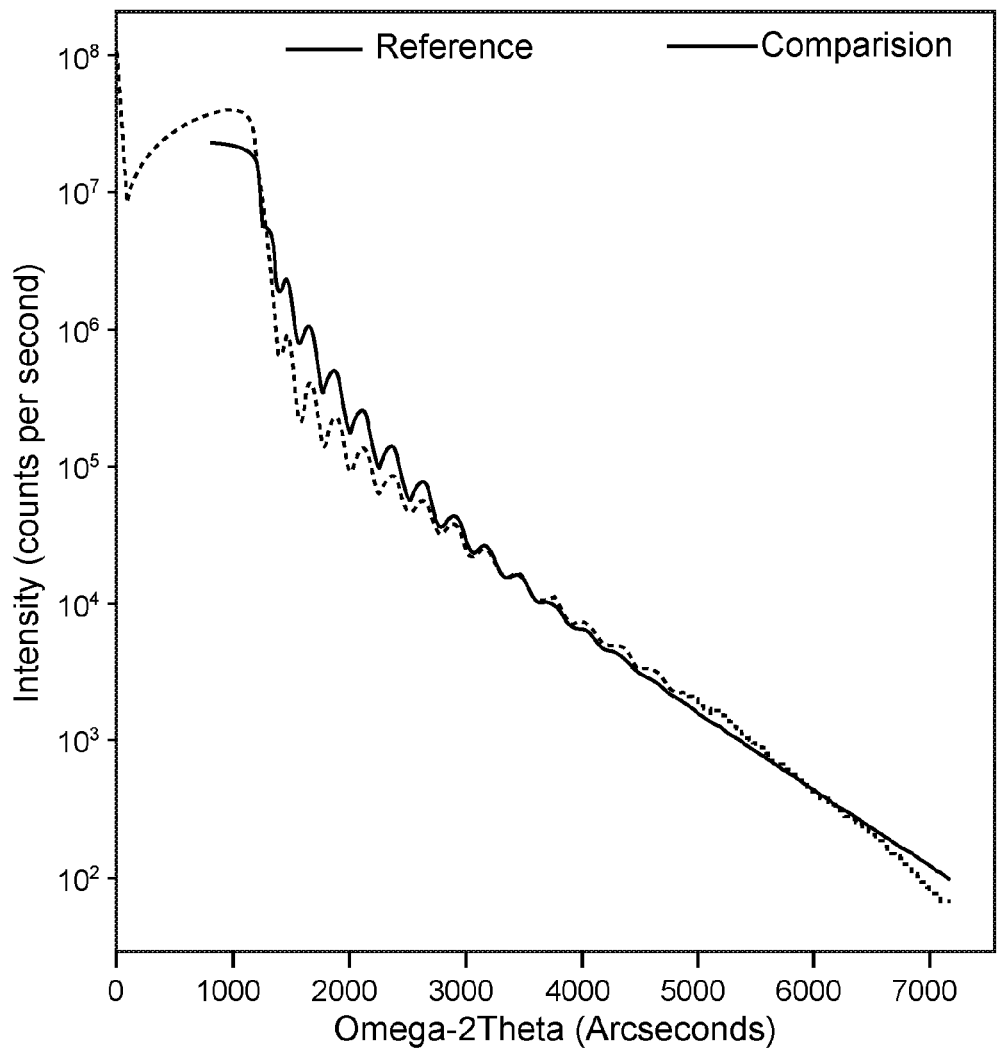
FIG. 2 is a graph of results from an X-ray reflectivity scan of a related art n-type GaN layer that is traditionally doped with silicon (Si) only.
Figure 3:
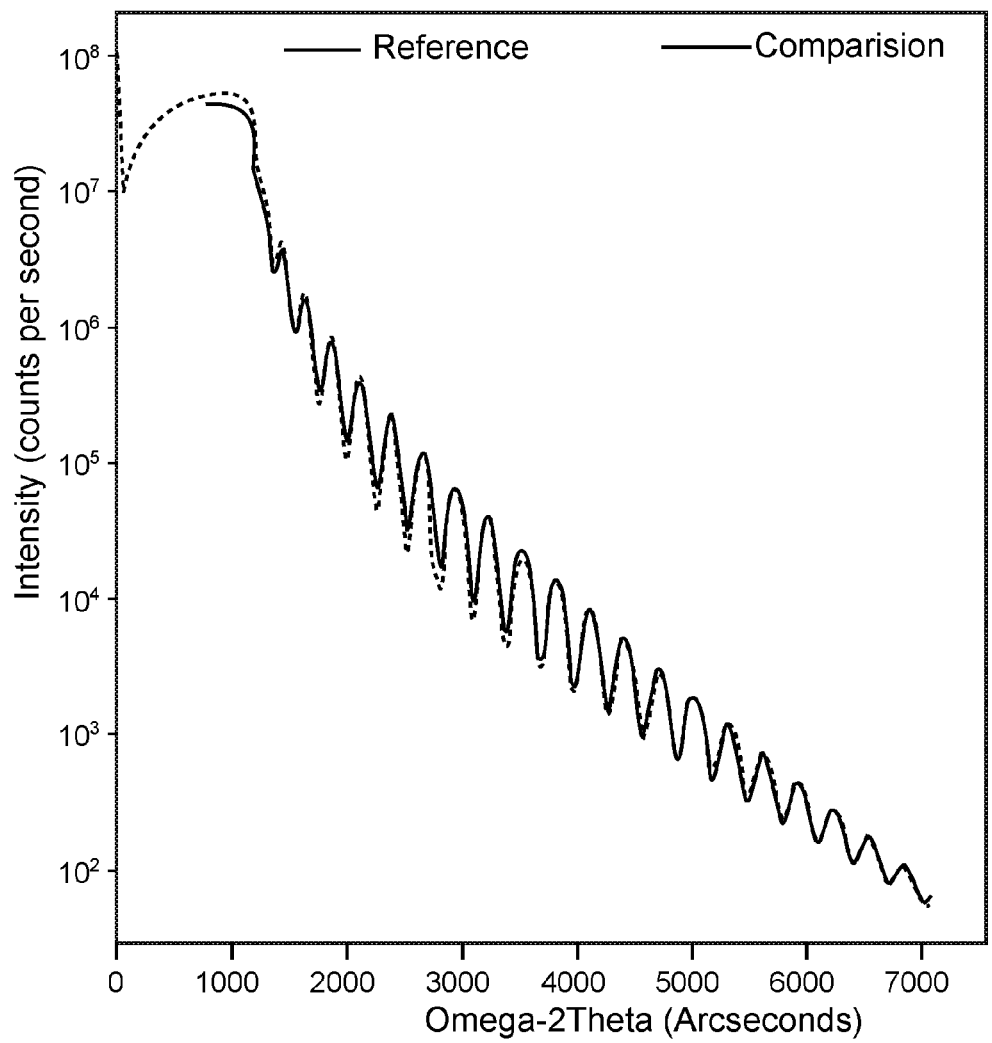
FIG. 3 is a graph of results from an X-ray reflectivity scan of an n-type GaN layer that is co-doped with Si and germanium (Ge) in accordance with the present disclosure.

FIG. 2 is a graph of results from an X-ray reflectivity scan of an n-type GaN layer that is traditionally doped with Si only. A relatively rapid attenuation of reflected intensity oscillations is evident in the graph of FIG. 2. The relatively rapid attenuation of the reflected intensity oscillations is due to a relatively high degree of roughness of a surface of the n-type GaN layer that results from traditional Si doping. The n-type GaN layer of FIG. 2 has a relatively low carrier concentration of no more than $1.31 \times 10^{20}$ cm$^{-3}$. In contrast, FIG. 3 is a graph of results from an N-type GaN layer that is co-doped with Si and Ge in accordance with the present disclosure. In this case, a relatively slower attenuation of reflected intensity oscillations is evident in FIG. 3. The relatively slower attenuation of the reflected intensity oscillations in FIG. 3 is due to a relatively lower degree of roughness of the surface on the n-type GaN layer that results from co-doping the n-type GaN layer with both Si and Ge. A root mean square (RMS) surface roughness that is no greater than 2 nm for a contact surface of the n-type GaN layer is determined from the graph of results from the X-ray reflectivity scan of the co-doped n-type GaN layer. Moreover, the n-type GaN layer of FIG. 3 has a relatively higher carrier concentration of at least $4.15 \times 10^{20}$ cm$^{-3}$.

A Lehighton measured sheet resistivity for the traditionally doped n-type 50 nm thick GaN layer of FIG. 2 is 109.9 ohms per square (ohms/sq), whereas a Hall measured sheet resistivity is 107.5 ohms/sq for the same traditionally doped 50 nm thick GaN layer of FIG. 2. In contrast, a Lehighton measured sheet resistivity for the co-doped 50 nm thick n-type GaN layer of FIG. 3 is 59.4 ohms/sq, whereas a Hall measured sheet resistivity is 58.9 ohms/sq for the same co-doped 50 nm thick n-type GaN layer of FIG. 3.

Figure 4:
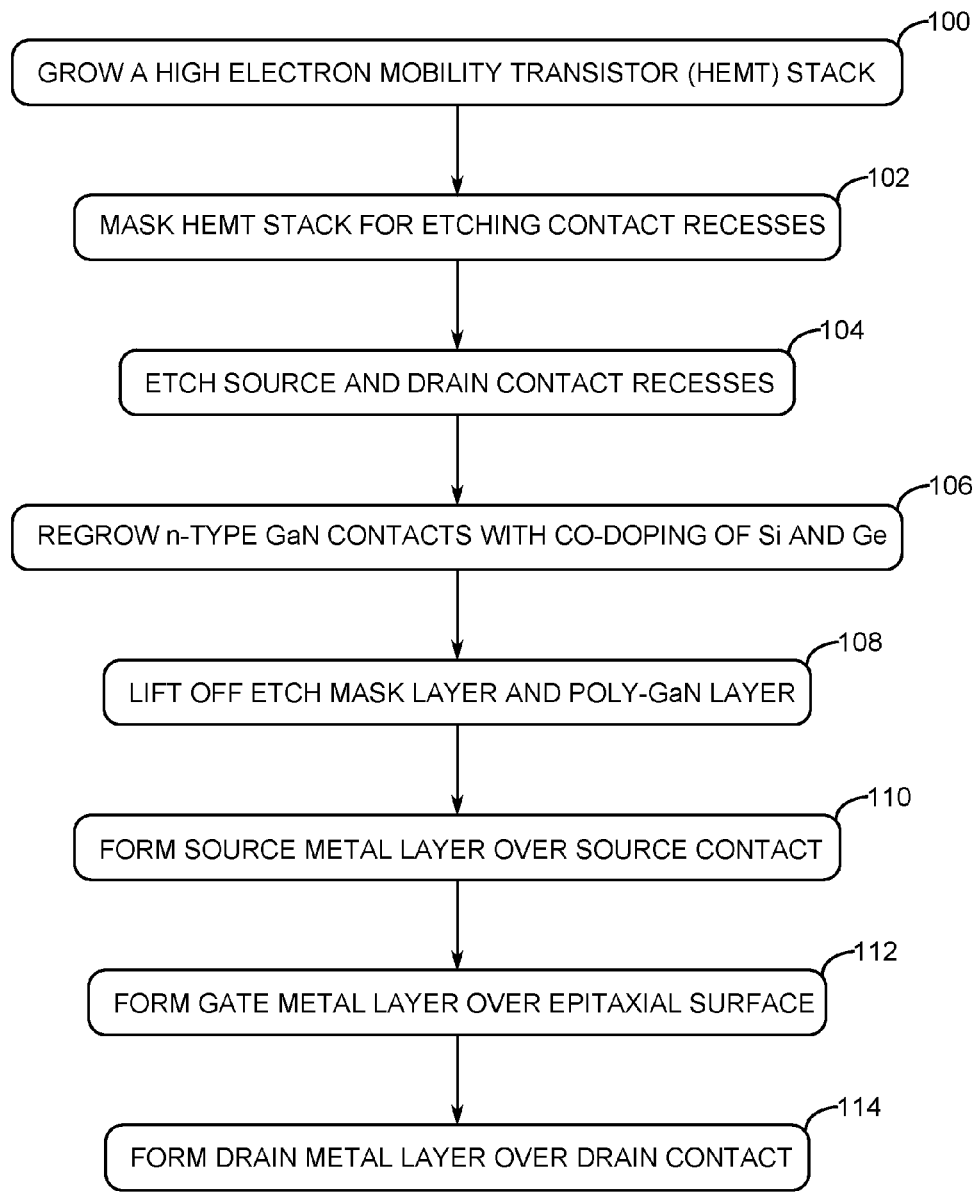
FIG. 4 is a process flow chart for a method of making the GaN based HEMT device of the present disclosure.
Figure 5:
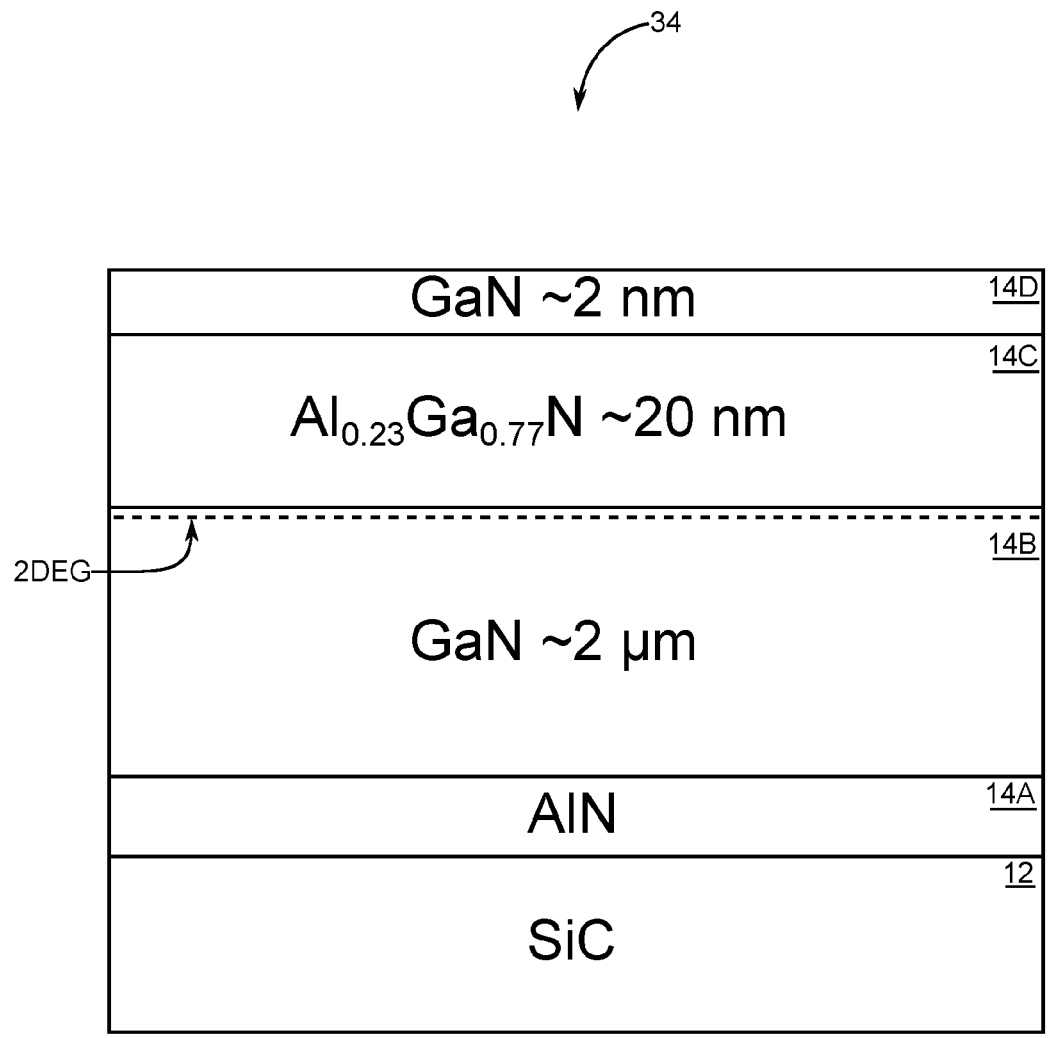
FIG. 5 is a HEMT stack from which the GaN based HEMT device is fabricated.

FIG. 4 is a process flow chart for a method of making the GaN based HEMT device 10 of FIG. 1. Fabrication of the GaN based HEMT device 10 begins with growing a HEMT stack 34 (FIG. 5) made up of substrate 12 and epitaxial layers 14A-14D (step 100).

Figure 6:
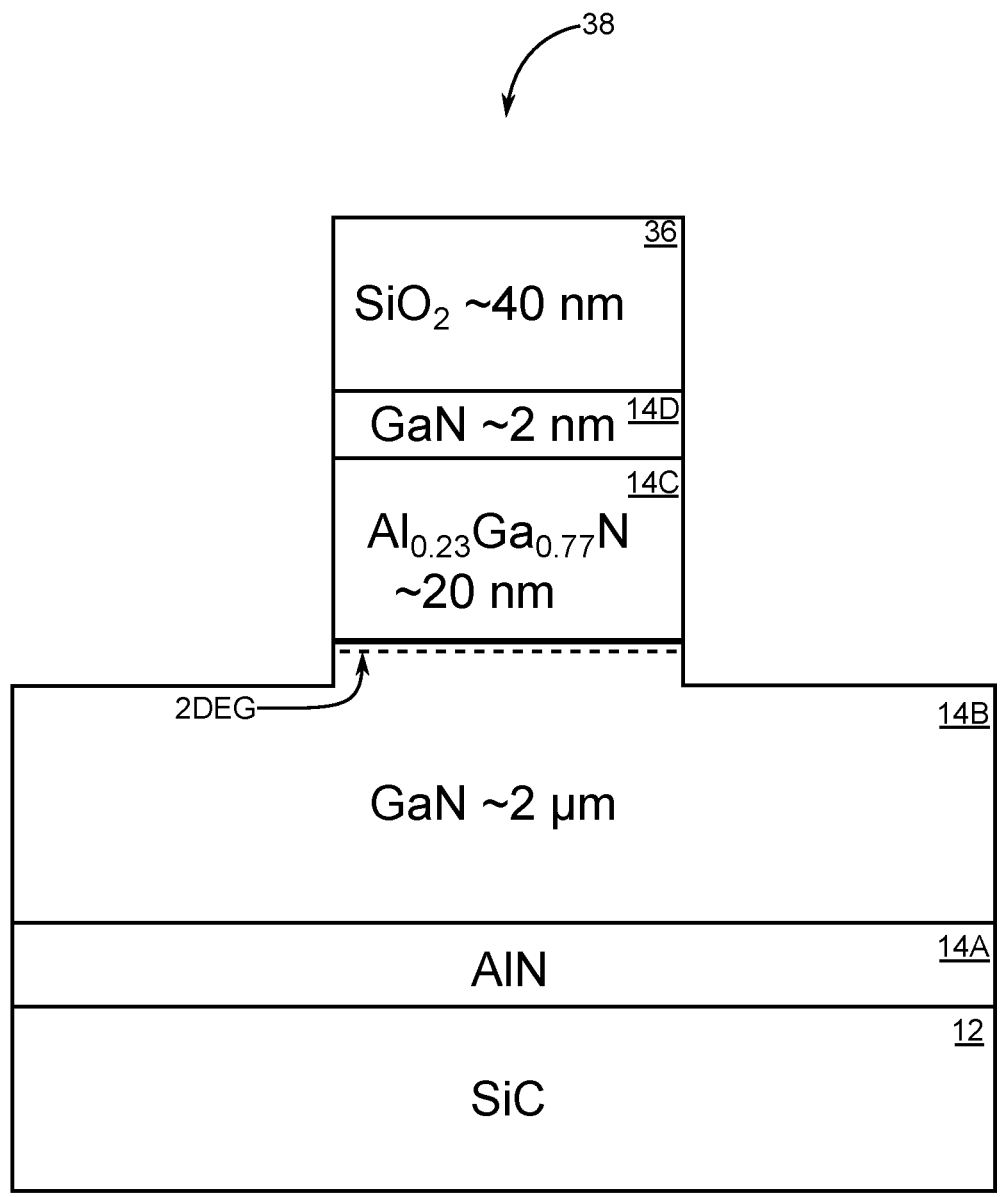
FIG. 6 is the HEMT stack of FIG. 5 after contact recesses have been etched.

Turning now also to FIG. 6, the process of FIG. 4 continues with masking the HEMT stack 34 with an etch mask 36 (step 102). In the exemplary embodiment of FIG. 6, the etch mask 36 is made up of silicon dioxide (SiO$_2$), however, other etch masks are available to those skilled in the art. A next step is etching source and drain contact recesses to realize a modified HEMT stack 38 (step 104).

Figure 7:
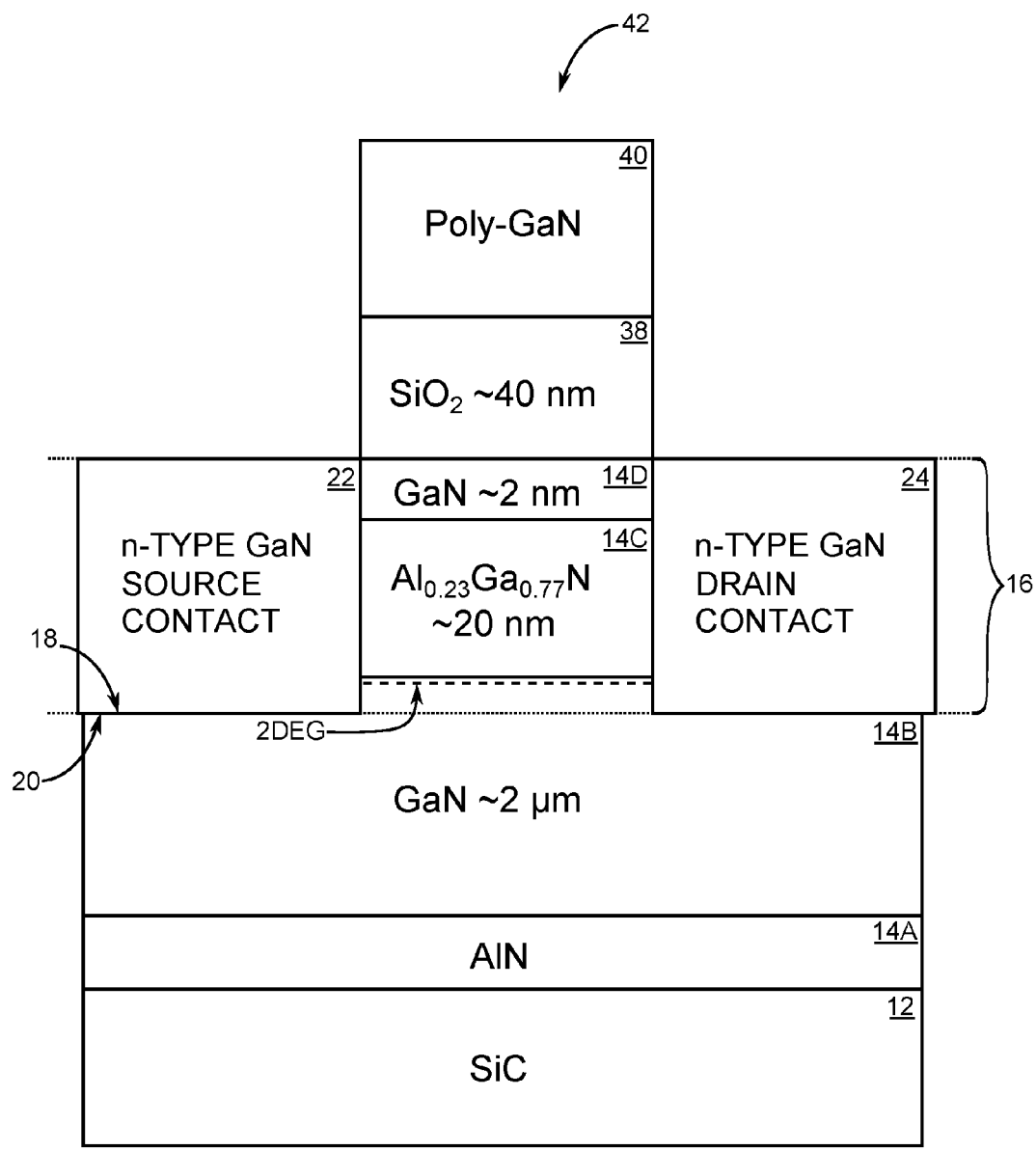
FIG. 7 is the HEMT stack after an n-type GaN layer that is co-doped with Si and germanium (Ge) and disposed onto a surface of epitaxial layers making up the HEMT in order to regrow a source contact and a drain contact.

Moving on to FIG. 7 while following the process of FIG. 4, a next step involves re-growing the source contact 22 and the drain contact 24 by disposing the n-type GaN layer 16 that is co-doped with Si and germanium (Ge) onto the surface 20 of epitaxial layers 14A-14D making up the HEMT 10 (step 106). A total dopant level of both Si and Ge that is in the range of $2 \times 10^{20}$ cm$^{-3}$ to $9 \times 10^{20}$ cm$^{-3}$ for the source contact 22 and the drain contact 24. A specific exemplary total dopant level for both Si and Ge falling within the above range is $5 \times 10^{20}$ cm$^{-3}$.

Figure 8:
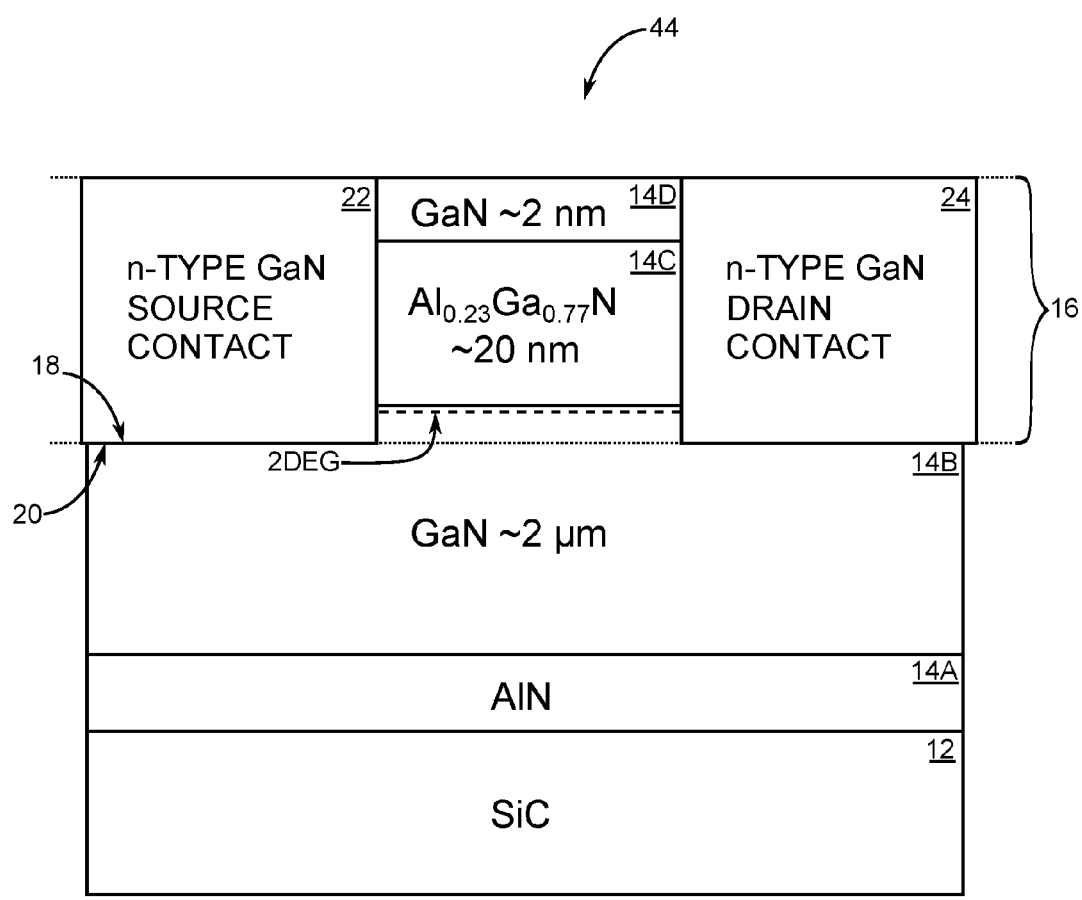
FIG. 8 is the HEMT stack after a lift off of an etch mask layer and poly-GaN layer.

The deposition of the n-type GaN layer 16 results in a poly-GaN layer 40 and modified HEMT stack 42. The poly-GaN layer 40 and the etch mask 36 are sacrificial layers that must be removed. Turning now to FIG. 8 while following the process of FIG. 4, lifting off the poly-GaN layer 40 and the etch mask 36 to provides modified HEMT stack 44 (step 108). At this point in the process, the HEMT stack 44 is ready for finishing steps that result in HEMT device 10 (FIG. 1). A first of the finishing steps is forming the source metal layer 26 over the source contact 22 (step 110). A second finishing step is forming the gate metal layer 30 over the epitaxial surface 32 (step 112). A third finishing step is forming a drain metal layer 28 over the drain contact (step 114). It is to be understood that forming the source metal layer 26 over the source contact 22 (step110) and forming a drain metal layer 28 over the drain contact (step 114) can be performed simultaneously.

Those skilled in the art will recognize improvements and modifications to the preferred embodiments of the present disclosure. All such improvements and modifications are considered within the scope of the concepts disclosed herein and the claims that follow.

What is claimed is:

1. A high electron mobility transistor (HEMT) device comprising:
    a substrate;
    epitaxial layers over the substrate; and
    an n-type gallium nitride (GaN) layer disposed on an interface surface of the epitaxial layers, wherein the n-type GaN layer is co-doped with silicon (Si) and germanium (Ge) that provide a carrier concentration of at least $1\times10^{20}$ cm$^{-3}$ and a root mean square (RMS) surface roughness that is no greater than 2 nm for a contact surface of the n-type GaN layer that is interfaced with the interface surface of the epitaxial layers.

2. The HEMT device of claim 1 wherein the GaN layer is a contact layer that is divided into a source contact and a drain contact, wherein the source contact and the drain contact are spaced apart from each other.

3. The HEMT device of claim 2 further including a gate contact that is disposed on another surface of the epitaxial layers, wherein the gate contact is spaced apart from both the source contact and the drain contact.

4. The HEMT device of claim 1 wherein the n-type GaN layer has a Ge dopant level that is in the range of $1\times10^{20}$ cm$^{-3}$ to $7\times10^{20}$ cm$^{-3}$.

5. The HEMT device of claim 1 wherein the n-type GaN layer has a total dopant level of both Si and Ge that is in the range of $2\times10^{20}$ cm$^{-3}$ to $9\times10^{20}$ cm$^{-3}$.

6. The HEMT device of claim 1, wherein the n-type GaN layer has a resistivity that is in the range of 100 micro-ohms cm ($\mu\Omega$·cm) to 300 $\mu\Omega$·cm.

7. The HEMT device of claim 1, wherein the n-type GaN layer has a Hall mobility that is finite and greater than 30 square centimeters per volt-seconds (cm$^2$/Vsec).

8. The HEMT device of claim 1, wherein the n-type GaN layer has a Hall carrier concentration in the range of $4\times10^{20}$ cm$^{-3}$ and $9\times10^{20}$ cm$^{-3}$.

9. The HEMT device of claim 1, wherein the n-type GaN layer has a resistivity that is in the range of 100 $\mu\Omega$·cm to 300 $\mu\Omega$·cm and a Hall carrier concentration in the range of $4\times10^{20}$ cm$^{-3}$ and $9\times10^{20}$ cm$^{-3}$.

10. The HEMT device of claim 1, wherein the n-type GaN layer has a Hall carrier concentration in the range of $4\times10^{20}$ cm$^{-3}$ and $9\times10^{20}$ cm$^{-3}$ and a Hall mobility that is finite and greater than 30 cm$^2$/Vsec.

11. A method of making a high electron mobility transistor (HEMT) device comprising:
    providing a substrate;
    disposing epitaxial layers onto the substrate;
    masking the epitaxial layers with an etch mask;
    etching a source contact recess and a drain contact recess to expose an interface surface on the epitaxial layers, wherein the source contact recess and the drain contact recess are spaced apart;
    disposing an n-type GaN layer within the source contact recess and the drain contact recess; and
    co-doping the n-type GaN layer with both silicon (Si) and germanium (Ge) to form a source contact within the source contact recess and form a drain contact within the drain contact recess such that the source contact and the drain contact each have a carrier concentration of at least $1\times10^{20}$ cm$^{-3}$ and a root mean square (RMS) surface roughness that is no greater than 2 nm for a contact surface of the n-type GaN layer that is interfaced with the interface surface of the epitaxial layers.

12. The method of making a HEMT device of claim 11 further including lifting off at least one sacrificial layer from the epitaxial layers to expose a gate surface that is spaced apart from both the source contact recess and the drain contact recess.

13. The method of making a HEMT device of claim 12 further comprising:
    forming a source metal layer on the source contact;
    forming a drain metal layer on the drain contact; and
    forming a gate metal layer on the gate surface.

14. The method of making a HEMT device of claim 11 wherein the n-type GaN layer has a Ge dopant level that is in the range of $1\times10^{20}$ cm$^{-3}$ to $7\times10^{20}$ cm$^{-3}$.

15. The method of making a HEMT device of claim 11 wherein the n-type GaN layer has a total dopant level of both Si and Ge that is in the range of $2\times10^{20}$ cm$^{-3}$ to $9\times10^{20}$ cm$^{-3}$.

16. The method of making a HEMT device of claim 11, wherein the n-type GaN layer has a sheet resistivity that is in the range of 100 $\mu\Omega$·cm to 300 $\mu\Omega$·cm.

17. The method of making a HEMT device of claim 11, wherein the n-type GaN layer has a Hall mobility that is finite and greater than 30 square centimeters per volt-seconds (cm$^2$/Vsec).

18. The method of making a HEMT device of claim 11, wherein the n-type GaN layer has a Hall carrier concentration in the range of $4\times10^{20}$ cm$^{-3}$ and $9\times10^{20}$ cm$^{-3}$.

19. The method of making a HEMT device of claim 11, wherein the n-type GaN layer has a sheet resistivity that is in the range of 100 $\mu\Omega$·cm to 300 $\mu\Omega$·cm and a Hall carrier concentration in the range of $4\times10^{20}$ cm$^{-3}$ and $9\times10^{20}$ cm$^{-3}$.

20. The method of making a HEMT device of claim 11, wherein the n-type GaN layer has a Hall carrier concentration in the range of $4\times10^{20}$ cm$^{-3}$ and $9\times10^{20}$ cm$^{-3}$ and a Hall mobility that is finite and greater than 30 cm$^2$/Vsec.

* * * * *